United States Patent [19]
Tu et al.

[11] Patent Number: 6,100,129
[45] Date of Patent: Aug. 8, 2000

[54] METHOD FOR MAKING FIN-TRENCH STRUCTURED DRAM CAPACITOR

[75] Inventors: Yeur-Luen Tu, Taichung; Chine-Gie Lou, Hsinchu Hsien, both of Taiwan

[73] Assignee: Worldwide Semiconductor Manufacturing Corporation, Hsinchu, Taiwan

[21] Appl. No.: 09/189,353

[22] Filed: Nov. 9, 1998

[51] Int. Cl.$^7$ .............................................. H01L 21/8244
[52] U.S. Cl. .............................. 438/238; 437/52; 437/60; 438/238; 438/240; 438/253; 438/255; 438/397; 438/398
[58] Field of Search ....................... 437/52, 60; 438/397, 438/253, 398, 255, 238, 240

[56] References Cited

U.S. PATENT DOCUMENTS

| | | | |
|---|---|---|---|
| 5,677,221 | 10/1997 | Tseng | 437/52 |
| 5,677,222 | 10/1997 | Tseng | 437/52 |
| 5,766,995 | 6/1998 | Wu | 438/255 |
| 5,851,897 | 12/1998 | Wu | 438/397 |
| 5,913,129 | 6/1999 | Wu et al. | 438/398 |

*Primary Examiner*—David Nelms
*Assistant Examiner*—Phuc Dang
*Attorney, Agent, or Firm*—Blakely, Sokoloff, Taylor, & Zafman LLP

[57] ABSTRACT

A method for manufacturing a fin-trench capacitor is disclosed. The method comprises the steps of: forming a plurality of alternating oxide and nitride layers including a top oxide layer, wherein said nitride layers are sandwiched between said oxide layers; forming a storage node contact opening in said plurality of alternating oxide and nitride layers, stopping at said landing pad; removing a portion of said nitride layers along sidewalls of said contract opening; forming a polysilicon layer over said top oxide layer and conformally along said sidewalls of said contact opening; depositing a photoresist layer into said contact opening; removing a portion of said polysilicon layer on top of said top oxide layer; forming a dielectric layer over said top oxide layer and conformally on top of said polysilicon layer along said sidewalls of said contact opening; forming a top conductive layer over said dielectric layer and in said contact opening.

8 Claims, 4 Drawing Sheets

METHOD FOR MAKING FIN-TRENCH STRUCTURED DRAM CAPACITOR

FIELD OF THE INVENTION

The present invention relates to semiconductor memories, and more particularly, to a method for making a fin-trench structured DRAM capacitor.

BACKGROUND OF THE INVENTION

It has been a recent trend in dynamic random access memory (DRAM) to increase the density of DRAM integrated circuits. However, as higher density DRAM cells are developed, the area available for capacitors that are used in the DRAM cells decreases. In order to decrease the area of capacitors while maintaining reliability standards, it is important to be able to maintain the capacitance of each capacitor while decreasing its footprint. Recently, capacitors having a three-dimensional structure have been suggested to increase cell capacitance. Such capacitors include, for example, double-stacked, fin-structured, cylindrical, spread-stacked, and box structured capacitors.

There is also a challenge to develop methods of manufacturing these capacitors that minimize the manufacturing costs and provide maximum process tolerance to maximize product yields. In one standard capacitor under bit line (CUB) process, a storage node contact is formed to connect to a landing pad. As is known in the art, a landing pad is frequently used for below submicron technology to reduce cell size. For example, Samsung Corp. of South Korea uses landing pad technology extensively. This is followed by formation of a storage node, deposition of oxide-nitride-oxide (ONO) and then formation of a capacitor top plate. This prior art process requires three photoresist masks to complete a DRAM capacitor, namely the photoresist masks used in forming the storage node contact, the storage node, and the capacitor top plate. Then, capacitor planarization is performed, and a bit line contact and a bit line are formed. As a result of the large step height of the storage node, which is typically about 4000 to 7000 angstroms, good planarization is difficult to achieve.

The present invention is directed to a method for forming a fin-trench structured DRAM capacitor and is preferably to be used in capacitor under bitline process. The present method reduces one photoresist mask layer and eliminates the capacitor planarization concern, while increasing capacitor area. Thus, the present method minimizes the manufacturing costs and provides maximum process tolerance to maximize product yields.

SUMMARY OF THE INVENTION

A method for manufacturing a fin-trench capacitor on a substrate including a landing pad connected to a source or drain region is disclosed. The method comprises the steps of: forming a plurality of alternating oxide and nitride layers including a top oxide layer, wherein said nitride layers are sandwiched between said oxide layers; forming a storage node contact opening in said plurality of alternating oxide and nitride layers, stopping at said landing pad; removing a portion of said nitride layers along sidewalls of said contact opening; forming an in-situ doped polysilicon layer over said top oxide layer and conformally along said sidewalls of said contact opening; depositing a photoresist layer into said contact opening; removing a portion of said polysilicon layer on top of said top oxide layer; removing said photoresist layer inside said contact opening; forming a thin dielectric layer over said top oxide layer and conformally on top of said polysilicon layer along said sidewalls of said contact opening; forming a top in situ doped polysilicon layer over said thin dielectric layer and in said contact opening.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to the accompanying drawings. The present invention provides a method of forming a DRAM capacitor having a fin-trench structure. The method reduces the number of required photoresist masks and eliminates capacitor planarization concerns.

Figure 1:
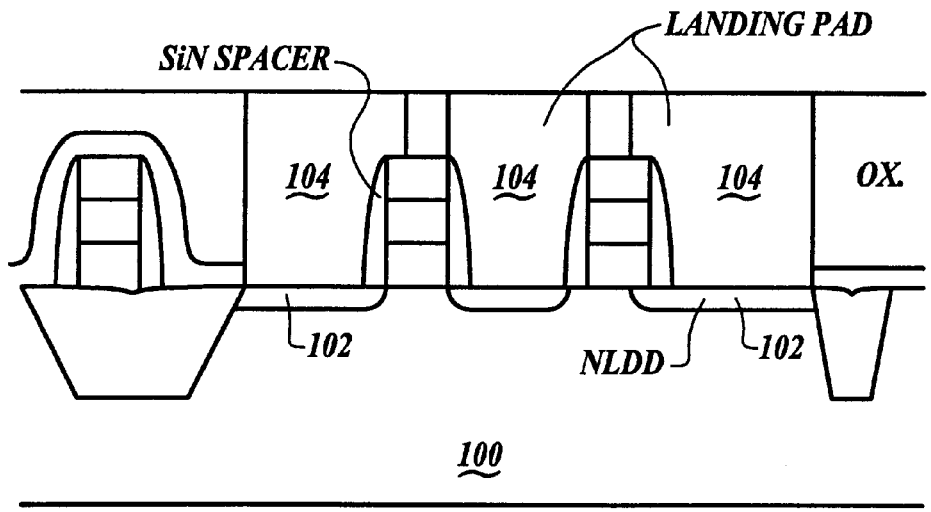
FIGS. 1–3 and 5–8 are cross-sectional views of a semiconductor substrate, including landing pads and source and drain regions, illustrating the steps in forming a fin-trench capacitor.

Turning to FIG. 1, a semiconductor substrated 100 is shown. The substrate is understood to possibly include a semiconductor wafer, active and passive devices formed within the wafer, and layers formed on the wafer's surface. The term "substrate" is meant to include devices formed within a semiconductor wafer and the layers overlying the wafer. In a preferred embodiment, the substrated 100 includes drain regions 102. Polysilicon landing pads 104 which connect to the drain regions 102 are formed atop the substrate. The methods for making such a substrated 100 and landing pads 104 are well-known and need not be discussed further herein.

Figure 2:
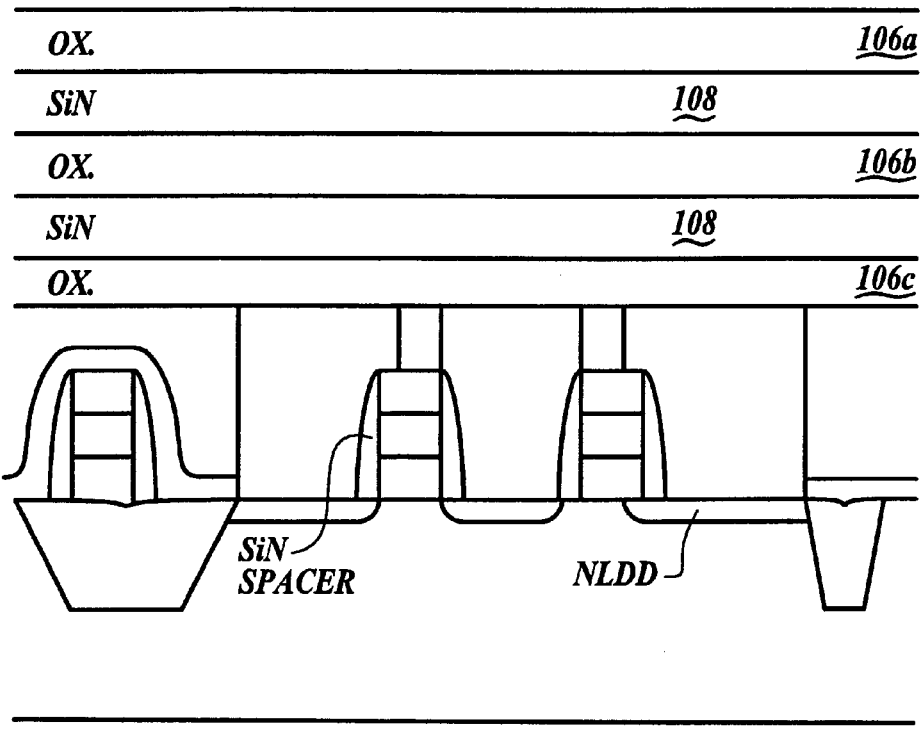

Turning to FIG. 2, alternating layers of oxide 106a–106c and nitride 108 are deposited. In the preferred embodiment, a bottom oxide layer 106a, an intermediate oxide layer 106b and a top oxide layer 106c are deposited, and are separated by two nitride layers 108. The thickness of each oxide layer is preferably about 500 to 1500 angstroms and the thickness of each nitride layer 108 is preferably about 1500 to 2500 angstroms. The oxide layers 106a–c are conventionally formed by low pressure chemical vapor deposition (LPCVD) and the nitride layers 108 are deposited by a conventional process, such as LPCVD.

Figure 3:
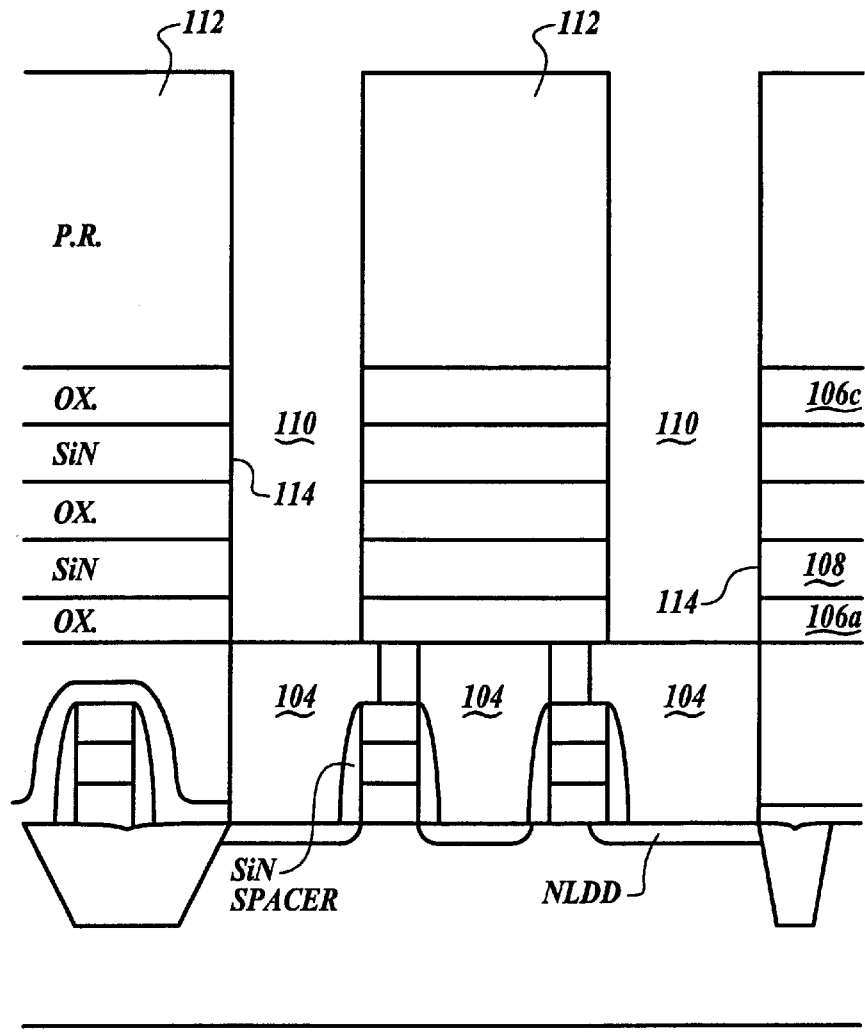
Figures 4A, 4B:
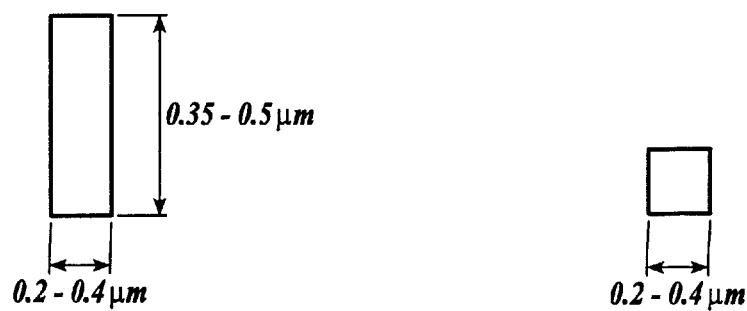
FIGS. 4A and 4B are top views of a photoresist mask used in forming a storage node contact opening, according to two embodiments of the present invention.

Turning to FIG. 3, storage node contact openings 110 are defined by using conventional photolithography and etching processes. Preferably, the contact openings 110 are positioned above the landing pads 104. For example, a photoresist layer 112 is deposited over the top oxide layer 106c. The photoresist layer 112 is patterned and developed to expose the contact openings 110. A top view of the photoresist mask is shown in FIGS. 4A and 4B. In one embodiment shown in FIG. 4A, the mask creates a 0.35 to 0.5 µm by 0.2 to 0.4 µm contact opening. In another embodiment shown in FIG. 4B, the mask creates a 0.2 to 0.4 µm by 0.2 to 0.4 µm contact opening. Normally, the contact opening size is preferably smaller than the landing pad size to avoid misalignment. One or more anisotropic etching steps are used to etch the oxide layers 106a–106c and the nitride layers 108 until the bottom oxide layer 106a is reached. Then a slow oxide etching process is performed and controlled to stop on the landing pads 104. Sidewalls 114 of the oxide layers 106a–106c and the nitride layers 108 are thereby exposed. The photoresist layer 112 is then removed using conventional methods.

Figure 5:
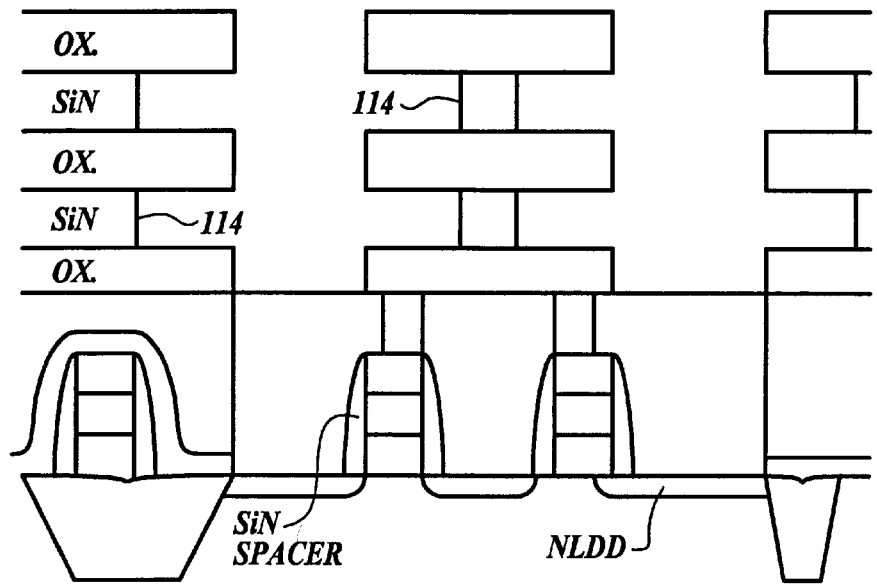

Turning to FIG. 5, the nitride layers 108 are then etched along its sidewalls 114 by using a heated solution of phosphoric acid, $H_3PO_4$. Preferably, about 500 to 3000 angstroms are removed from the nitride layers 108 in the lateral direction.

Figure 6:
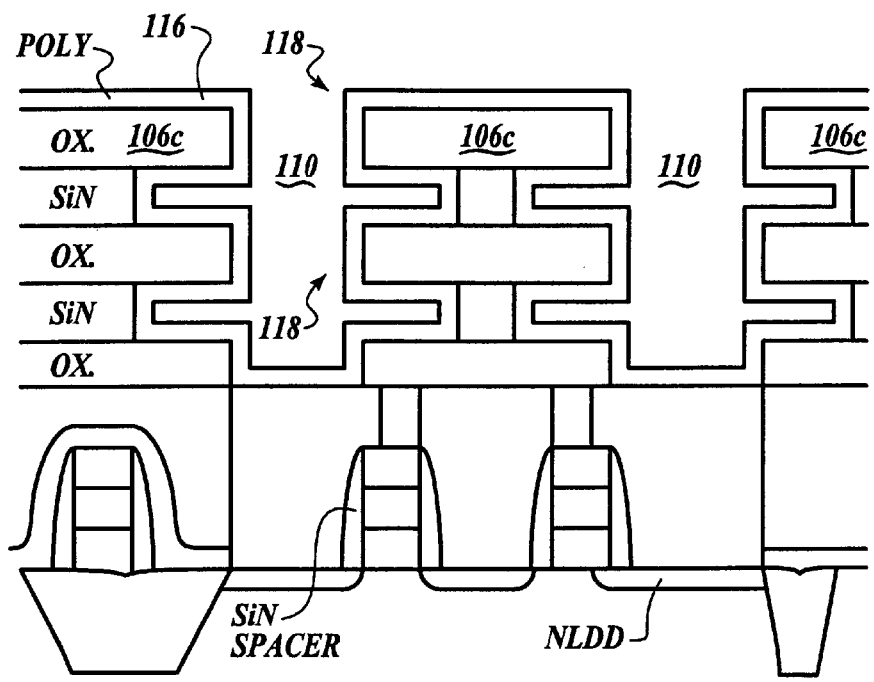

Turning to FIG. 6, an in-situ doped polysilicon layer 116 is conformally deposited over the top oxide layer 106c and into the contact openings or trenches 110 using conventional chemical vapor deposition (CVD) methods. As illustrated in FIG. 6, the in-situ doped polysilicon layer 116 does not completely fill the contact openings 110. The thickness of the polysilicon layer 116 depends on the thickness of the nitride layers 108 and is preferably about 250 to 750 angstroms. The polysilicon layer 116 connects to the landing pads 104 and serves as the capacitor bottom electrode. Although two fins 118 are illustrated in FIG. 6, it is understood that the structure may include any number of fins by deposition of fewer or additional oxide and nitride layers.

Figure 7:
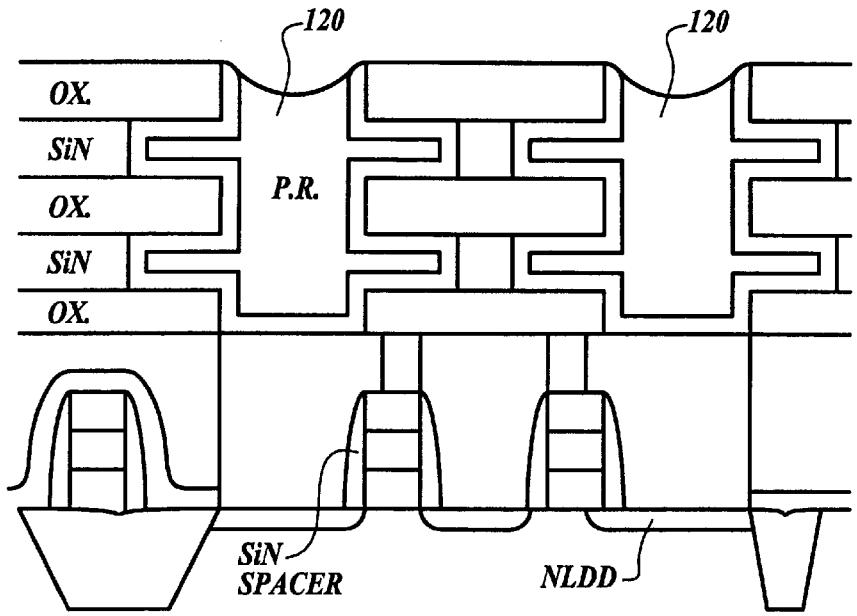

Turning to FIG. 7, a layer of spin on photoresist 120 is deposited onto the surface of the in-situ doped polysilicon layer 116 and also fills the trenches 110. An etch-back is then performed until the photoresist 120 not in the trenches 110 is removed. Further, the etch-back is further performed to remove the portion of the polysilicon layer 116 atop the top oxide layer 106c. The spin on photoresist 120 protects the portion of the polysilicon layer 116 on the sidewalls of the trenches 110. The resulting structure is seen in FIG. 7.

Figure 8:
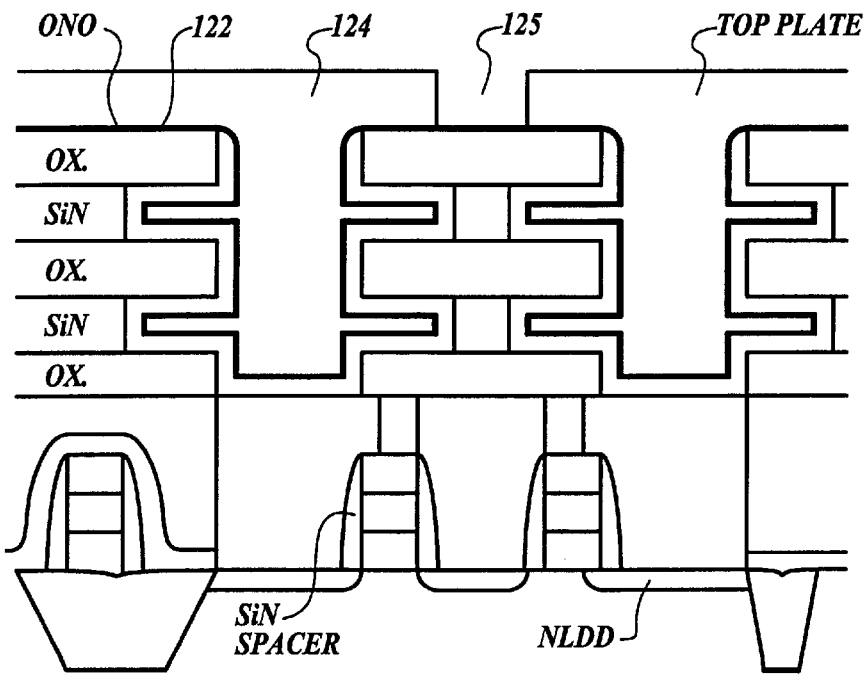

Turning to FIG. 8, the spin on photoresist 120 in the trenches 110 is then stripped. Finally, to complete the capacitor, any conventional capacitor dielectric 122 (such as oxide/nitride/oxide or nitride/oxide) is deposited and an in-situ doped top polysilicon layer 124 is deposited. The in-situ doped top polysilicon layer is preferable about 500 to 2000 angstroms in thickness and fills the trenches 110. Conventional photolithography and etching processes are performed on the top polysilicon layer 124 to form an opening 125.

The opening 125 in layer 124 is for the bit line contact to connect to the landing pad. Since the topography height after the in-situ doped top polysilicon layer 124 patterning and etching is only 500 to 1500 angstroms, BPSG flow or BPSG flow and etchback is sufficient to achieve good planarization for the following bit line contact and bit line. In contrast, in a prior art process, a topography height of 5000 to 8500 angstroms is present when a storage node of 4000 to 7000 angstroms and a top plate of 500 to 1500 angstroms is included.

While the preferred embodiment of the invention has been illustrated and described, it will be appreciated that various changes can be made therein without departing from the spirit and scope of the invention.

What is claimed is:

1. A method for manufacturing a fin-trench capacitor on a substrate including a landing pad connected to a source or drain region, the method comprising:

forming a plurality of alternating oxide and nitride layers including a top oxide layer, wherein said nitride layers are sandwiched between said oxide layers;

forming a storage node contact opening in said plurality of alternating oxide and nitride layers, said storage node contact stopping at said landing pad;

removing a portion of said nitride layers along the sidewalls of said contract opening;

forming an in-situ doped polysilicon layer over said top oxide layer, conformally along said sidewalls of said contact opening so that said doped polysilicon layer does not completely fill said contact opening, and contacting said landing pad;

depositing a photoresist layer into said contact opening;

removing a portion of said in-situ doped polysilicon layer on top of said top oxide layer;

removing said photoresist layer;

forming a thin dielectric layer over said top oxide layer and conformally on top of said in-situ doped polysilicon layer along said sidewalls of said contact opening;

forming a in-situ doped top polysilicon layer over said thin dielectric layer and in said contact opening.

2. The method of claim 1, wherein each oxide layer is about 500 to 1500 angstroms thick.

3. The method of claim 1, wherein each nitride layer is about 1500 to 2500 angstroms thick.

4. The method of claim 1, wherein said portion of said nitride layers removed is about 500 to 3000 angstroms in the lateral direction.

5. The method of claim 1, wherein said in-situ doped polysilicon layer is about 250 to 750 angstroms in thickness.

6. The method of claim 1, wherein said thin dielectric layer is oxide/nitride/oxide or nitride oxide.

7. The method of claim 1, wherein said plurality of alternating oxide and nitride layers includes three or more oxide layers and two or more nitride layers.

8. The method of claim 1, wherein said portion of said nitride layers along sidewalls of said contact opening is removed by a heated solution of $H_3PO_4$.

* * * * *